US008826734B2

(12) United States Patent
Ohkoshi et al.

(10) Patent No.: US 8,826,734 B2
(45) Date of Patent: Sep. 9, 2014

(54) INERTIAL FORCE SENSOR (71) Applicant: Panasonic Corporation, Osaka (JP)

(72) Inventors: Hideo Ohkoshi, Osaka (JP); Tomohiro Mitani, Fukui (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/027,783

(22) Filed: Sep. 16, 2013

(65) Prior Publication Data

US 2014/0020466 A1    Jan. 23, 2014

Related U.S. Application Data (63) Continuation of application No. 12/673,870, filed as application No. PCT/JP2008/002359 on Aug. 29, 2008, now Pat. No. 8,646,332.

(30) Foreign Application Priority Data

Sep. 3, 2007  (JP) ................................ 2007-227742

(51) Int. Cl.
| | |
|---|---|
| *G01P 1/02* | (2006.01) |
| *G01C 19/56* | (2012.01) |
| *B81B 7/00* | (2006.01) |
| *G01P 1/00* | (2006.01) |
| *G01C 19/5607* | (2012.01) |
| *B81C 1/00* | (2006.01) |

(52) U.S. Cl.
CPC ............... *G01P 1/003* (2013.01); *B81B 7/0058* (2013.01); *B81B 2201/025* (2013.01); *G01P 1/023* (2013.01); *G01C 19/5607* (2013.01); *B81C 1/0023* (2013.01)
USPC .......................... 73/493; 73/504.12; 73/504.16

(58) Field of Classification Search
USPC ................... 73/493, 504.04, 504.12, 504.14, 73/504.15, 504.16, 514.32, 514.33, 73/514.34, 431
See application file for complete search history.

(56) References Cited

U.S. PATENT DOCUMENTS 5,656,776 A  * 8/1997 Otani ............................. 73/493
6,007,668 A   12/1999 Kodani et al.
(Continued)

FOREIGN PATENT DOCUMENTS

| JP | 2001-004379 A | 1/2001 |
|---|---|---|
| JP | 2002-071353 A | 3/2002 |

(Continued)

OTHER PUBLICATIONS

International Search Report for PCT/JP2008/002359, dated Dec. 2, 2008.

(Continued)

*Primary Examiner* — Helen Kwok
(74) *Attorney, Agent, or Firm* — Pearne & Gordon LLP (57) ABSTRACT

An inertial sensor includes oscillating-type angular velocity sensing element (32), IC (34) for processing signals supplied from angular velocity sensing element (32), capacitor (36) for processing signals, and package (38) for accommodating angular velocity sensing element (32), IC (34), capacitor (36). Element (32) and IC (34) are housed in package (38) via a vibration isolator, which is formed of TAB tape (46), plate (40) on which IC (34) is placed, where angular velocity sensing element (32) is layered on IC (34), and outer frame (44) placed outside and separately from plate (40) and yet coupled to plate (40) via wiring pattern (42).

26 Claims, 7 Drawing Sheets (56) References Cited

U.S. PATENT DOCUMENTS

| | | | |
|---|---|---|---|
| 6,400,044 B1 | 6/2002 | Lohberg et al. | |
| 6,748,807 B2 * | 6/2004 | Yoshiuchi et al. | 73/493 |
| 6,810,736 B2 * | 11/2004 | Ikezawa et al. | 73/493 |
| 6,848,306 B2 * | 2/2005 | Kunda | 73/514.01 |
| 6,880,399 B1 * | 4/2005 | Okoshi et al. | 73/493 |
| 7,127,945 B2 * | 10/2006 | Ookoshi | 73/493 |
| 7,234,364 B2 * | 6/2007 | Ohta | 73/862.08 |
| 7,249,509 B2 * | 7/2007 | Hirano | 73/504.12 |
| 7,263,885 B2 * | 9/2007 | Goto | 73/514.32 |
| 7,467,552 B2 * | 12/2008 | MacGugan | 73/493 |
| 7,497,117 B2 * | 3/2009 | Ohta | 73/493 |
| 7,540,190 B2 * | 6/2009 | Sasaki | 73/493 |
| 7,571,647 B2 * | 8/2009 | Takemasa et al. | 73/493 |
| 7,640,807 B2 * | 1/2010 | Tamura et al. | 73/514.33 |
| 8,156,804 B2 * | 4/2012 | Sakai et al. | 73/493 |
| 8,225,660 B2 * | 7/2012 | Sakai et al. | 73/504.12 |
| 2001/0023615 A1 * | 9/2001 | Matsumoto et al. | 73/514.32 |
| 2002/0046604 A1 * | 4/2002 | Ishikawa et al. | 73/504.12 |
| 2002/0184947 A1 * | 12/2002 | Yamazaki | 73/504.12 |
| 2003/0154787 A1 * | 8/2003 | Yoshiuchi et al. | 73/493 |
| 2004/0200279 A1 | 10/2004 | Mitani et al. | |
| 2004/0209399 A1 | 10/2004 | Sunohara et al. | |
| 2004/0226373 A1 * | 11/2004 | Sakaguchi | 73/514.16 |
| 2005/0066724 A1 | 3/2005 | Hiraoka et al. | |
| 2005/0172713 A1 * | 8/2005 | Hosokawa et al. | 73/493 |
| 2005/0257615 A1 * | 11/2005 | Ohta | 73/504.12 |
| 2006/0000294 A1 * | 1/2006 | Ohta | 73/862.08 |
| 2006/0005624 A1 * | 1/2006 | Hirano | 73/504.04 |
| 2006/0021434 A1 * | 2/2006 | Kutsuna | 73/514.12 |
| 2006/0042381 A1 * | 3/2006 | Still | 73/493 |
| 2006/0049497 A1 * | 3/2006 | Ohta | 257/678 |
| 2006/0174704 A1 * | 8/2006 | Tsubaki | 73/514.16 |
| 2007/0044558 A1 | 3/2007 | Ohta | |
| 2008/0034867 A1 * | 2/2008 | Kazama et al. | 73/514.33 |
| 2009/0100929 A1 | 4/2009 | Ohkoshi | |
| 2010/0089155 A1 | 4/2010 | Sugihara et al. | |
| 2010/0328832 A1 | 12/2010 | Hasunuma et al. | |

FOREIGN PATENT DOCUMENTS

| | | |
|---|---|---|
| JP | 2002-530684 A | 9/2002 |
| JP | 2004-028913 A | 1/2004 |
| JP | 2004-271479 A | 9/2004 |
| JP | 2005-106584 A | 4/2005 |
| JP | 2006-78248 A | 3/2006 |
| JP | 2006-194681 A | 7/2006 |
| JP | 2007-040766 A | 2/2007 |
| JP | 2007-064753 A | 3/2007 |
| WO | 03/046479 A1 | 6/2003 |
| WO | 2006/132277 A1 | 12/2006 |
| WO | 2007/015418 A1 | 2/2007 |

OTHER PUBLICATIONS

Chinese Office Action dated Apr. 13, 2011.

English Abstract and Machine Translation of JP 2004-028913 A, previously cited in an IDS dated Feb. 17, 2010.

* cited by examiner

FIG. 10
PRIOR ART

INERTIAL FORCE SENSOR

REFERENCE TO RELATED APPLICATION

This application is a continuation of U.S. patent application Ser. No. 12/673,870, filed on Feb. 17, 2010, which claims priority from Japanese Patent Application No. 2007-227742, filed Sep. 27, 2007, the entire contents of which are incorporated herein by reference.

TECHNICAL FIELD

The present invention relates to inertial sensors to be used in various electronic devices for posture control or navigation of mobile units such as aircraft, automobiles, robots, ships, and vehicles.

BACKGROUND ART

Figure 9:
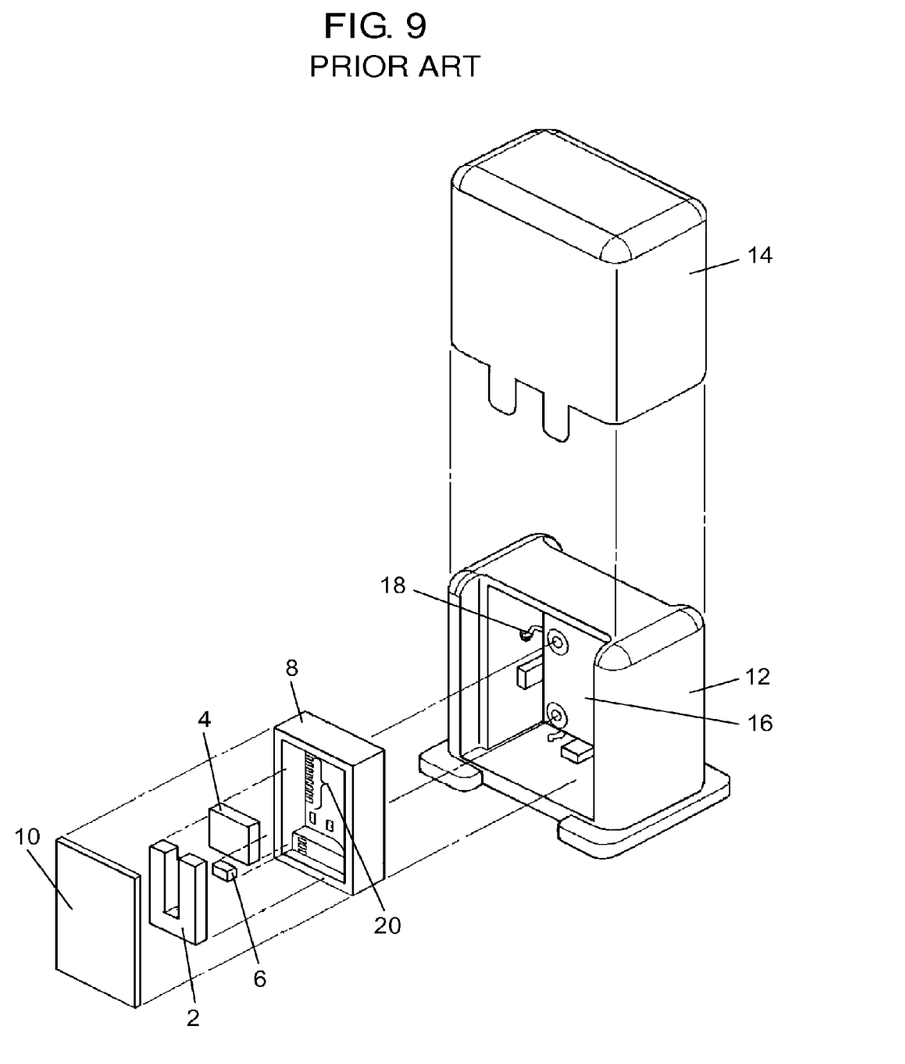
FIG. 9 shows an exploded perspective view of a conventional angular velocity sensor.
Figure 10:
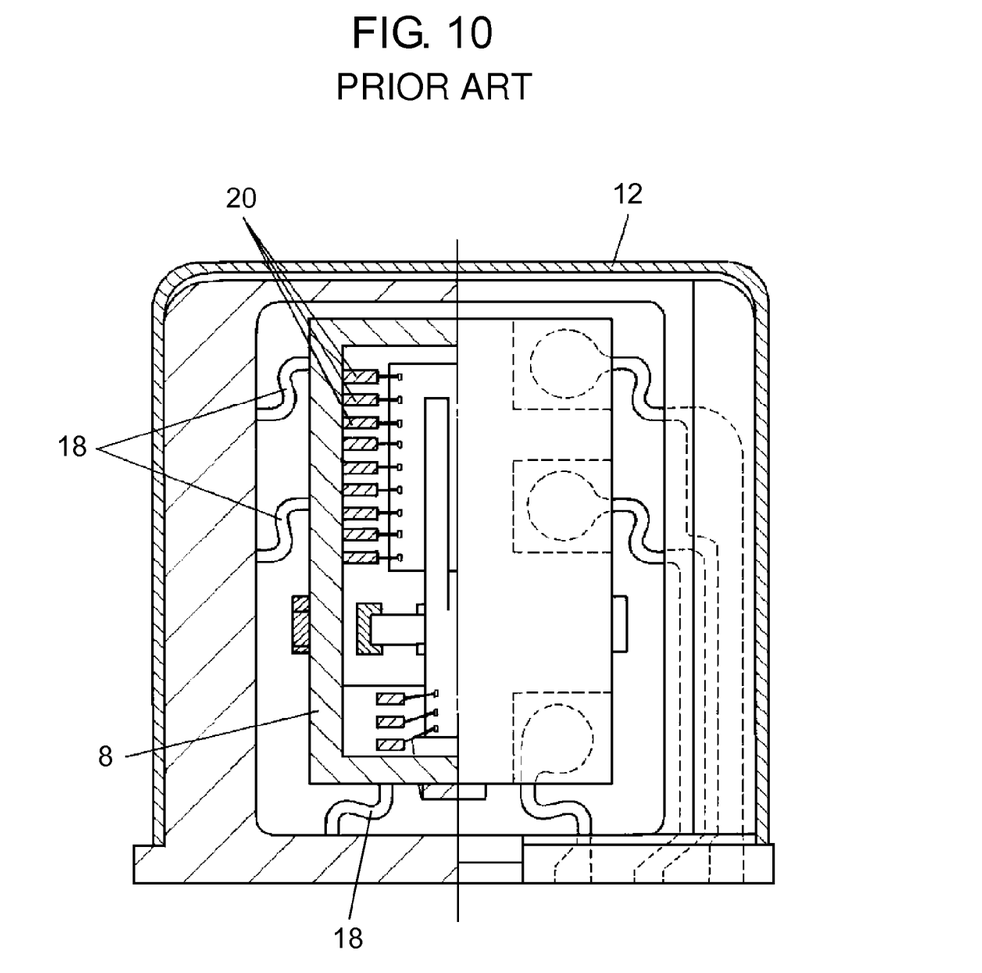
FIG. 10 shows a sectional view of the conventional angular velocity sensor.

FIG. 9 shows an exploded perspective view of a conventional angular velocity sensor. FIG. 10 shows a sectional view of the conventional angular velocity sensor. As shown in FIG. 9 and FIG. 10, the conventional angular velocity sensor comprises the following structural elements:
- oscillating-type angular velocity sensing element 2 formed of an oscillator shaped like a tuning-fork;
- IC 4 for processing signals supplied from angular velocity sensing element 2, and
- capacitor 6 for processing signals.

Sensing element 2, IC 4 and capacitor 6 are arranged and mounted in housing 8. Housing 8 closed with lid 10 is accommodated in package 12, and is protected by cover 14.

Plate 16 is formed inside package 12 for receiving housing 8 thereon. Plate 16 is coupled to package 12 via terminals 18 having bends each shaped like letter "S". Terminal 18, angular velocity sensing element 2, and IC 4 are coupled to one another via electrode pads 20 placed in housing 8, and signals are input or output via terminals 18.

The foregoing angular velocity sensor is mounted corresponding to a target shaft to be sensed, whereby the sensor is used for a posture controller or a navigation device of mobile units such as vehicles. In the structure discussed above, plate 16 on which housing 8 is placed is coupled to package 12 via terminals 18 each of which has a bend shaped like a letter "5". This structure thus allows reducing disturbance vibrations caused by an impact and applied to the sensor. Patent Literature 1 is known as related art to the present invention.

Since angular velocity sensing element 2 and IC 4 are arranged in housing 8, they occupy a greater area in housing 8. Sensing element 2 is electrically coupled to terminal 18 via electrode pads 20 of housing 18, and IC 4 is also electrically coupled to terminal 18 via pads 20, so that housing 8 needs a large number of electrode pads 20. As a result, housing 8 resists being downsized.

Patent Literature 1: International Publication Number 03/046479 pamphlet.

DISCLOSURE OF INVENTION

The present invention aims to provide an inertial sensor which features damping disturbance vibrations, reducing an area for mounting an angular velocity sensing element and an IC, reducing the number of electrode pads to be used for inputting/outputting signals, and being downsized.

A vibration isolator of the inertial sensor of the present invention is formed of a plate, on which an IC is mounted, where an angular velocity sensing elements is layered on the IC, and an outer frame placed outside and spaced from the plate and yet coupled to the plate via wiring patterns. The plate is held in midair by the wiring patterns and mounted to a package via the outer frame. The angular velocity element or the IC is electrically coupled to the wiring patterns.

Since the angular velocity sensing element is layered on the IC, the mounting area on the plate occupied by the sensing element can be reduced, and yet, the plate is held in midair by the wiring patterns and, via the outer frame, coupled to the package linked to the plate. The wiring patterns thus work as a vibration isolator for absorbing the disturbance vibrations.

Since the angular velocity element is electrically coupled to the wiring patterns, and the IC is also electrically coupled to the wiring patterns, the number of electrical joints can be reduced, which results in downsizing the sensor.

On top of that, a reliably mountable area can be obtained on the IC, and each one of the wiring patterns is loaded with a greater mass, so that the wiring patterns can absorb the greater amount of vibrations. In other words, the present invention allows the inertial sensor to damp the disturbance vibrations and to be downsized without lowering the sensing accuracy.

DESCRIPTION OF REFERENCE SIGNS 32, 61 angular velocity sensing element
33, 55, 66, 71 acceleration sensing section
34, 67 IC
36 capacitor
38, 68 package
40, 63 plate
42, 64 wiring pattern
44, 65 outer frame
46 TAB tape
47 step
48 electrode pad for element
50 electrode pad for IC 52 electrode pad for connection
54 bonding wire
62 vibration isolator

BEST MODE FOR CARRYING OUT THE INVENTION

Embodiment 1

Figure 1:
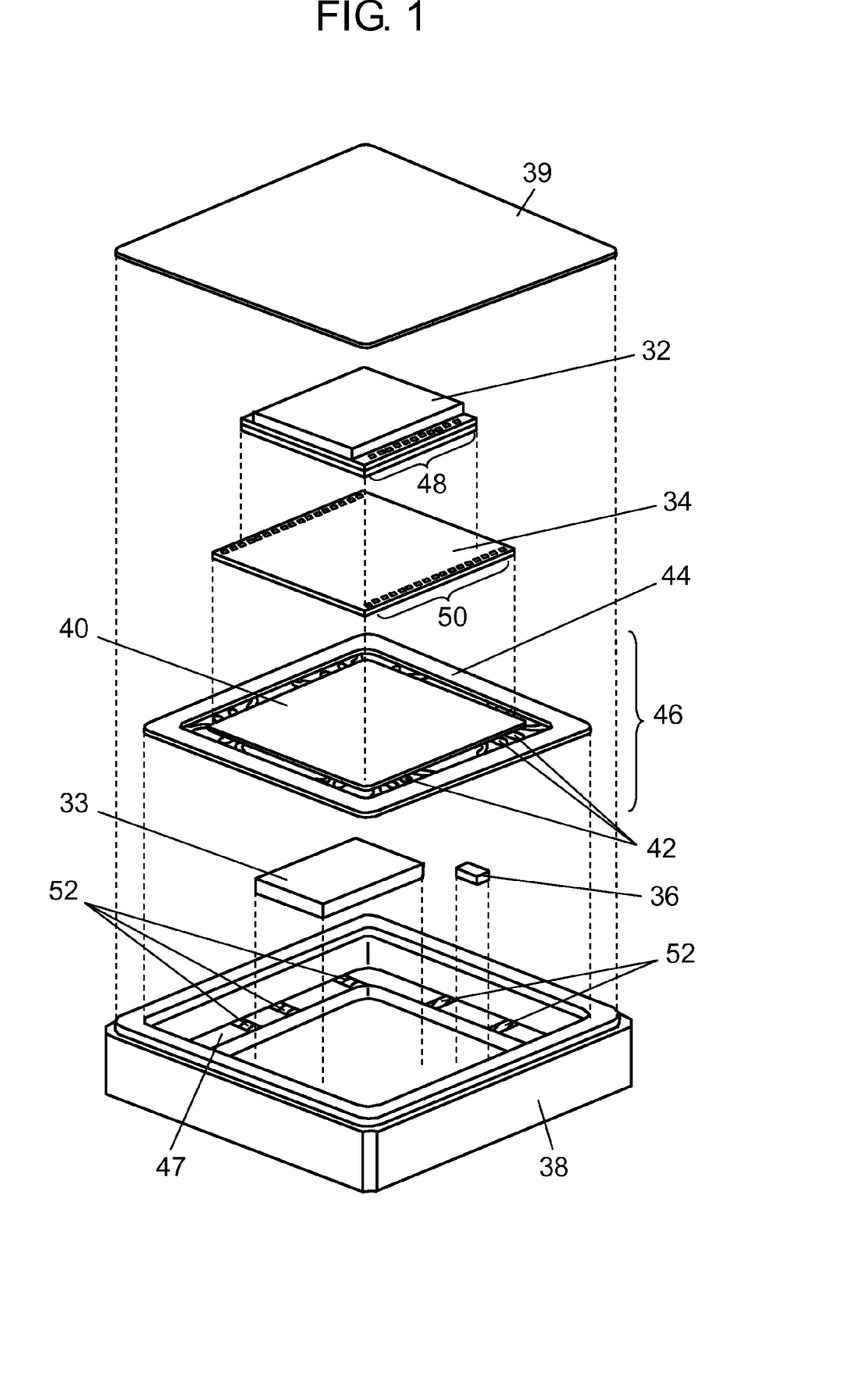
FIG. 1 shows an exploded perspective view of an angular velocity sensor in accordance with a first embodiment of the present invention.
Figure 2:
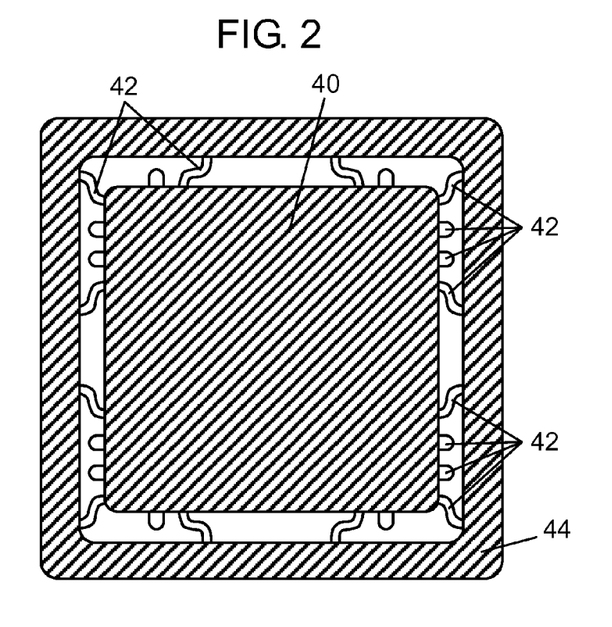
FIG. 2 shows a plan view of a vibration isolator of the angular velocity sensor in accordance with the first embodiment of the present invention.
Figure 3:
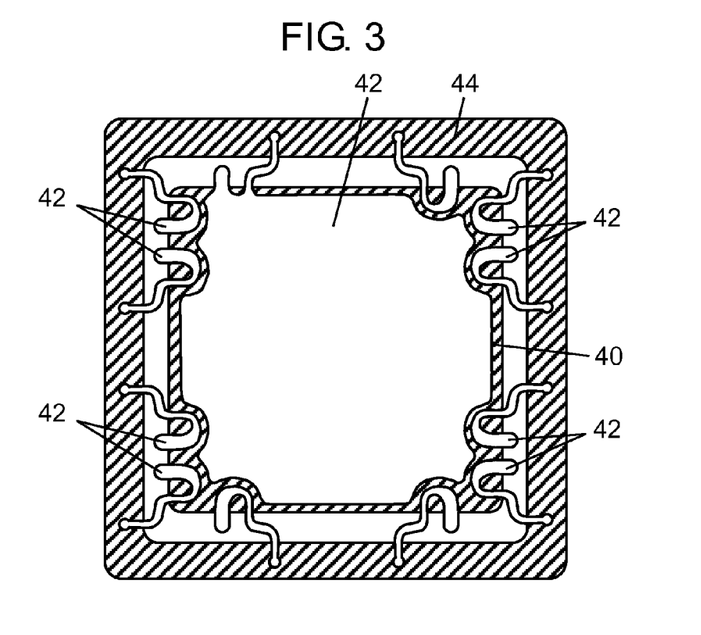
FIG. 3 shows a bottom view of the vibration isolator of the angular velocity sensor in accordance with the first embodiment of the present invention.
Figure 4:
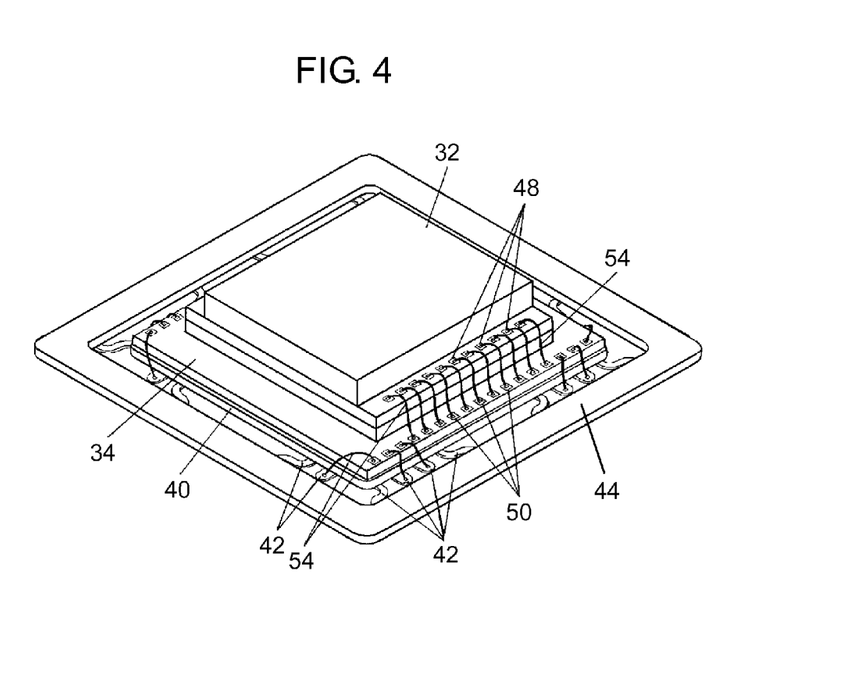
FIG. 4 shows a perspective view of the angular velocity sensor, not yet accommodated in a housing, in accordance with the first embodiment of the present invention.

FIG. 1 shows an exploded perspective view of an angular velocity sensor in accordance with the first embodiment of the present invention. FIG. 2 shows a plan view of a vibration isolator of the angular velocity sensor in accordance with the first embodiment. FIG. 3 shows a bottom view of the vibration isolator of the angular velocity sensor in accordance with the first embodiment. FIG. 4 shows a perspective view of the angular velocity sensor, not yet accommodated in a housing, in accordance with the first embodiment.

As shown in FIG. 1-FIG. 4, the angular velocity sensor comprises the following structural elements:
  oscillating-type angular velocity sensing element 32 formed of an oscillator shaped like a tuning-fork;
  acceleration sensing section 33 formed of an acceleration sensor;
  IC 34 for processing signals supplied from angular velocity sensing element 32 and acceleration sensing section 33;
  capacitor 36 for processing signals;
  package 38; and
  lid 39.

Package 38 and lid 39 accommodate angular velocity sensing element 32, acceleration sensing section 33, IC 34, and capacitor 36. Angular velocity sensing element 32 and IC 34 are accommodated in package 38 via a vibration isolator. Acceleration sensing section 33 is placed on the inner bottom face of package 38.

The vibration isolator is formed of TAB (Tape Automated Bonding) tape 46 which comprises the following elements:
  plate 40 on which IC 34 is placed, where angular velocity sensing element 32 is layered on IC 34; and
  outer frame 44.

Outer frame 44 is placed outside plate 40 and isolated from plate 40 although it is coupled to plate 40 via wiring patterns 42. Angular velocity sensing element 32 and IC 34 are placed on plate 40 such that the gravity center of angular velocity sensing element 32, that of IC 34, and that of plate 40 can be aligned on one axis.

Plate 40 and outer frame 44 are made of insulating film. Wiring patterns 42 are bonded to the insulating film such that they can be point-symmetric in shape and in position with respect to the center of plate 40. Outer frame 44 of TAB tape 46 is situated on step 47 provided on the bottom face of package 38, so that plate 40 is held in midair. "Holding in midair" refers to as the vibration isolator is mounted to step 47 while it is spaced away from the bottom of package 38. Capacitor 36, of which height is smaller than that of step 47, is placed by using this space.

Angular velocity sensing element 32 includes element electrode-pads 48 working for inputting/outputting signals. IC 34 includes IC electrode-pads 50 working for inputting/outputting signals, and package 38 includes connecting electrode-pads 52 working for coupling to pads 48 or to pads 50. Pads 50 are placed outside sensing element 32, and are electrically coupled to pads 48 or wiring patterns 42. Element electrode-pads 48, IC electrode-pads 50, and wiring patterns 42 are coupled together electrically with bonding wires 54. Wiring patterns 42 are electrically coupled to pads 52. Signals are input or output via wiring patterns 42.

The foregoing angular velocity sensor is mounted, corresponding to a subject shaft to be sensed, to a posture controller or a navigation device of a movable unit such as a vehicle.

As discussed above, since angular velocity sensing element 32 is layered on IC 34, the mounting area on plate 40 can be reduced, so that the sensor can be downsized. On top of that, plate 40 is held in midair and coupled, via wiring patterns 42, to outer frame 44 which is mounted to package 38, so that wiring patterns 42 work as a vibration isolator for absorbing the disturbance vibrations. As a result, the structure discussed above allows the sensor to damp the disturbance vibrations and to be downsized with the sensing accuracy maintained.

Figure 5:
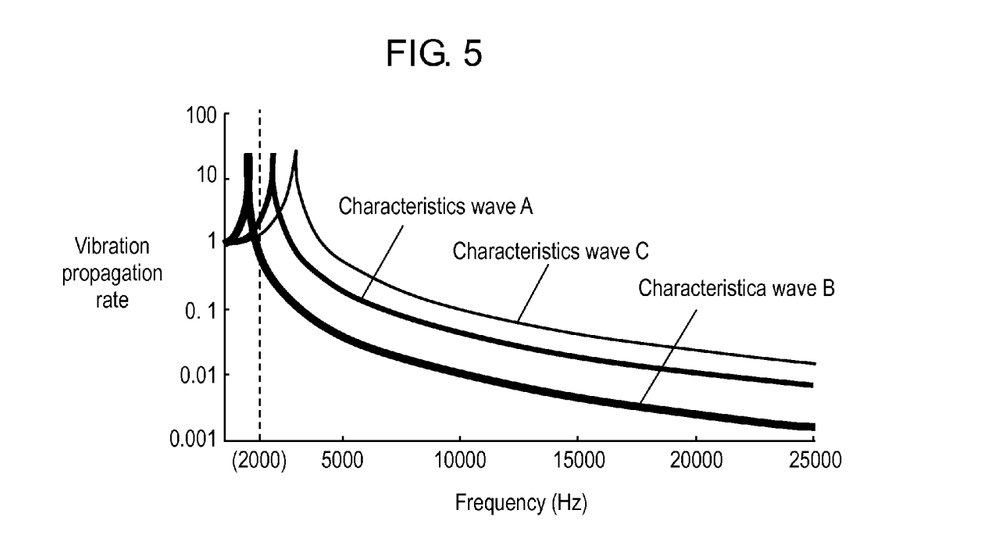
FIG. 5 shows attenuation characteristics which illustrate the relations between the frequencies of disturbance vibrations and vibration propagating rates.

FIG. 5 shows attenuation characteristics which illustrate the relations between the frequencies of disturbance vibrations and vibration propagating rates. In FIG. 5, assume that characteristics wave A is a reference attenuation-characteristics wave, and then the vibration propagating rate takes the maximum value along wave A when the frequency of the disturbance vibration arrives around 2000 Hz. The propagating rate lowers as the frequency rises higher. Along characteristics wave B, the propagation rate takes the maximum value at a lower frequency than along wave A. Along characteristics wave C, the rate takes the maximum value at a higher frequency than along wave A. Both of the propagation rates of waves B and C lower as the frequencies rise higher. Comparison of wave A with wave B reveals that wave B attenuates in greater amount than wave A in a higher frequency area than the disturbance vibrations frequency at which the propagation rates of wave A takes the maximum value. Comparison of wave A with wave C reveals that wave A attenuates in greater amount than wave C in a higher frequency area than the disturbance vibrations frequency at which the propagation rates of wave C takes the maximum value. The resonant vibration frequency is expressed with the following equation:

$$f = \alpha \sqrt{\frac{k}{m}} \tag{1}$$

where "f" is the resonant vibration frequency at which the propagation rate takes the maximum value, "α" is a coefficient, "k" is a spring constant produced by wiring patterns 42, and "m" is a total mass of the objects supported by outer frame 44 via wiring patterns 42. In this first embodiment, "m" chiefly represents the total mass of plate 40, angular velocity sensing element 32 and IC 34.

The inertial sensor (angular velocity sensor) of the first embodiment of the present invention has the following characteristics:
  angular velocity sensing element 32 has a vibration frequency of approx. 22000 Hz, and includes rigidity of "k" as well as a greater mass of "m" in order to obtain a waveform of excellent attenuation characteristics, such as characteristics waveform B, on the higher frequency side.

To be more specific, the total mass (m) of the objects supported by outer frame 44 via wiring patterns 42 is increased by layering angular velocity sensing element 32 onto IC 34, so that the disturbance vibrations at the higher frequency side can be absorbed in greater amount. While angular velocity sensing element 32 vibrates at around 22000 Hz, a disturbance vibration, of which frequency is similar to this vibration frequency, applied to element 32 can be efficiently attenuated by the structure discussed above for reducing the adverse effect of the disturbance vibration to the vibration of angular velocity sensing element 32.

Since the gravity center of element 32, that of IC 34, and that of plate 40 are aligned on one axis, a uniform mass is applied to wiring patterns 42 with respect to the center, i.e. the gravity center of plate 40. Angular velocity sensing element 32 thus can be steadily placed on plate 40, so that element 32 can be prevented from degrading its sensitivity.

In the case where the gravity center of plate 40 and that of IC 34 are misaligned from the one axis or the gravity center of plate 40 and that of angular velocity sensing element 32 are misaligned from the one axis due to, e.g. external force acting on the sensor, the moment caused by the misalignment acts on plate 40. Element 32 then cannot be placed steadily on plate 40, thereby sometimes adversely affecting the sensitivity of element 32. The foregoing alignment of the gravity centers of element 32, IC 34, and plate 40 on the one axis includes that the gravity centers thereof are aligned substantially on the one axis.

Since angular velocity sensing element 32 is layered on IC 34, element 32 can be steadily mounted onto IC 34 even when element 32 is miniaturized. Oscillating-type angular velocity sensing element 32 includes an oscillating section to oscillate and a fixing section to mount itself fixedly. The area of the fixing section, which does not oscillate, takes a rather smaller part of the total area of element 32, so that this fixing section is placed on IC 34 for mounting element 32 to IC 34, whereby the stability of element 32 can be increased and the degradation in the characteristics thereof can be prevented.

Angular velocity sensing element 32 is electrically coupled to wiring patterns 42 with bonding wires 54 as well as IC 34 is electrically coupled to wiring patterns 42 with bonding wires 54, so that the number of electrical joints in package 38 can be reduced. As a result, the sensor can be downsized.

On top of that, angular velocity sensing element 32 is placed on IC 34 for obtaining more stability, and the IC electrode-pads are placed outside the element 32. IC 34 is placed on plate 40 which works as a part of the vibration isolator, and wiring patterns 42 are placed outside the IC 34. This structure allows coupling the element electrode-pads 48 to the IC electrode-pads electrically as the need arises, so that all of the element electrode-pads 48 or all of the IC electrode-pads 50 are not necessarily electrically coupled to connection electrode-pads 52 placed inside the package 38. In other words, a reduction in the number of connection electrode-pads 52 still allows electrical connections between element electrode-pads 48, IC electrode-pads 50, or wiring patterns 42 and connection electrode-pads 52. As a result, the number of electrode pads working for inputting/outputting signals can be reduced, thereby downsizing the sensor.

Plate 40 and outer frame 44 are made of insulating film, and use of TAB tape 46, formed by bonding the wiring patterns 42 to the insulating film, allows forming the vibration isolator with ease.

Wiring patterns 42 can be point-symmetric with respect to the center of plate 40, or line-symmetric with respect to the centerline extending through the center of plate 40. This structure prevents plate 40 from lowering the absorption rate of the disturbance vibrations along a specific direction. When wiring patterns 42 form point-symmetric shapes with respect to the center of plate 40 at least in the portions between plate 40 and outer frame 44, an advantage similar to what is discussed above can be produced.

Figure 6:
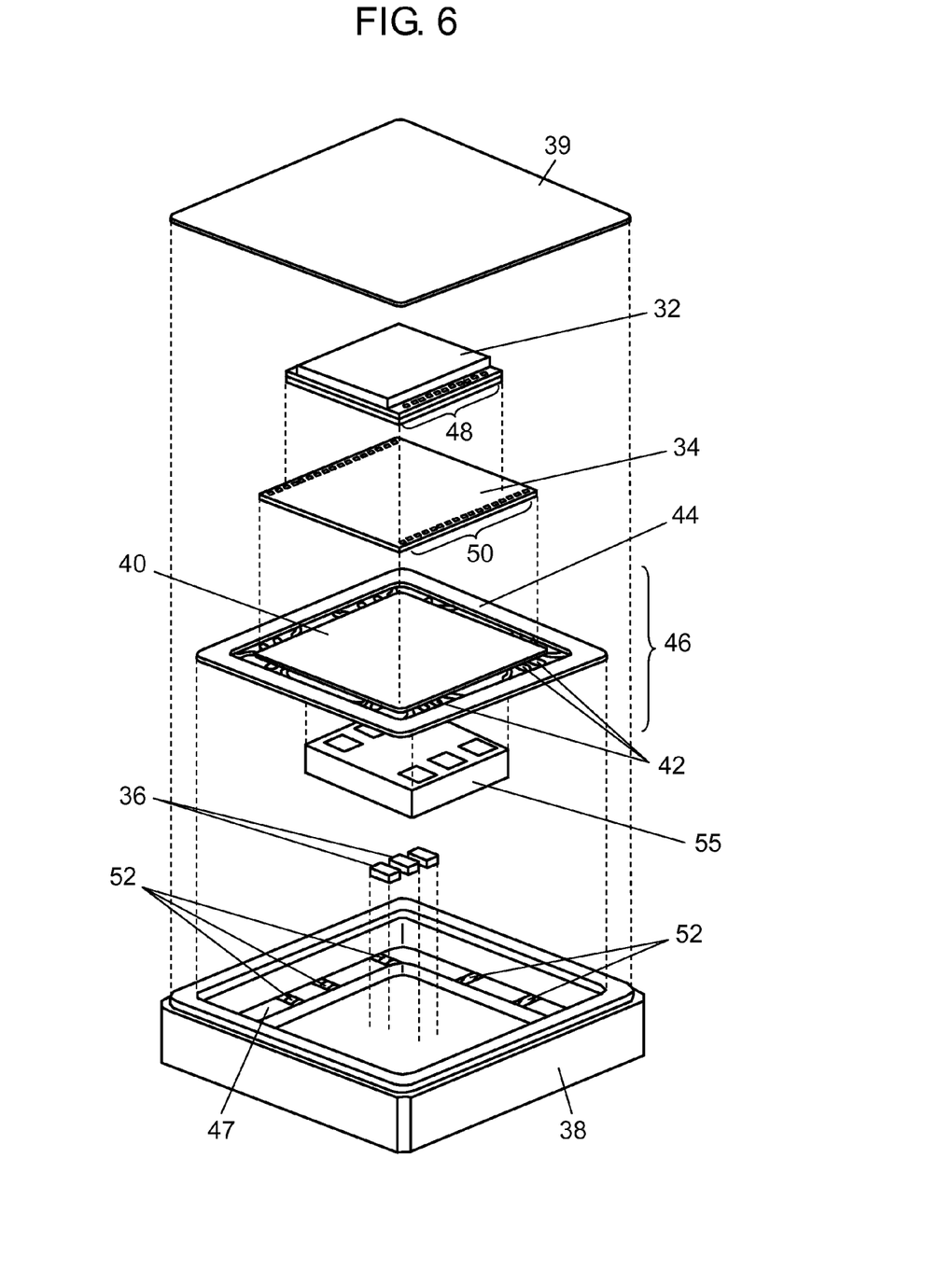
FIG. 6 shows an exploded perspective view of another angular velocity sensor in accordance with the first embodiment of the present invention.

FIG. 6 shows an exploded perspective view of another angular velocity sensor in accordance with the first embodiment of the present invention. Although FIG. 1 shows acceleration sensing section 33 placed on the inner bottom face of package 38, FIG. 6 shows acceleration sensing section 55 placed on the underside of plate 40 working as a part of the vibration isolator. The total mass of angular velocity sensing element 32 and IC 34 placed on the top face of plate 40 is made approximately equal to the mass of acceleration sensing section 55 placed on the underside of plate 40. This structure allows preventing an angular velocity different from the angular velocity to be sensed by angular velocity sensing element 32 from occurring caused by the deviation of the total gravity center of element 32, IC 34, plate 40 and acceleration sensing section 55. This structure also prevents another acceleration than the acceleration to be sensed by acceleration sensing section 55 from occurring. As a result, the accuracy of sensing signals of the angular velocity or the acceleration can be improved.

Embodiment 2

Figure 7:
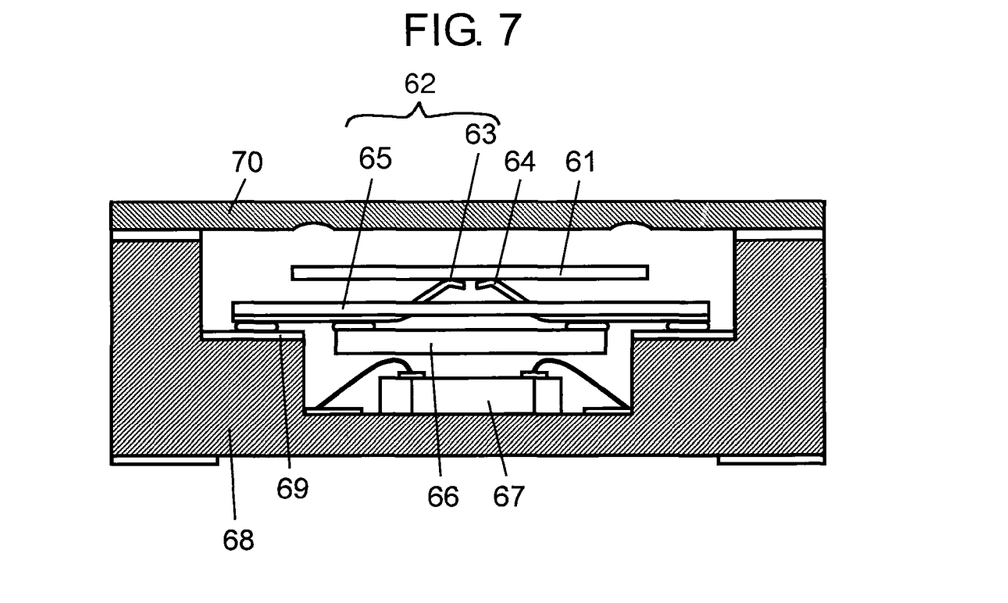
FIG. 7 shows a lateral sectional view of an angular velocity sensor in accordance with a second embodiment of the present invention.

FIG. 7 shows a lateral sectional view of an angular velocity sensor in accordance with a second embodiment of the present invention. In FIG. 7, vibration isolator 62 is formed of plate 63 and outer frame 65 coupled to plate 63 with wiring patterns 64. Angular velocity sensing element 61 is held in midair on the top face of plate 63. Acceleration sensing section 66 formed of an acceleration sensor is placed on the underside of outer frame 65 working as a part of vibration isolator 62. IC 67 processes signals supplied from angular velocity sensing element 61 and acceleration sensing section 66. Package 68 includes step 69 to which outer frame 65 of vibration isolator 62 is fixed. IC 67 is placed on the inner bottom face of package 68. Lid 70 closes package 68.

Plate 63 of vibration isolator 62 is held in midair and mounted to package 68 by means of outer frame 65 coupled to plate 63 via wiring patterns 64. Wiring patterns 64 thus work as the vibration isolator for absorbing the disturbance vibrations.

Figure 8:
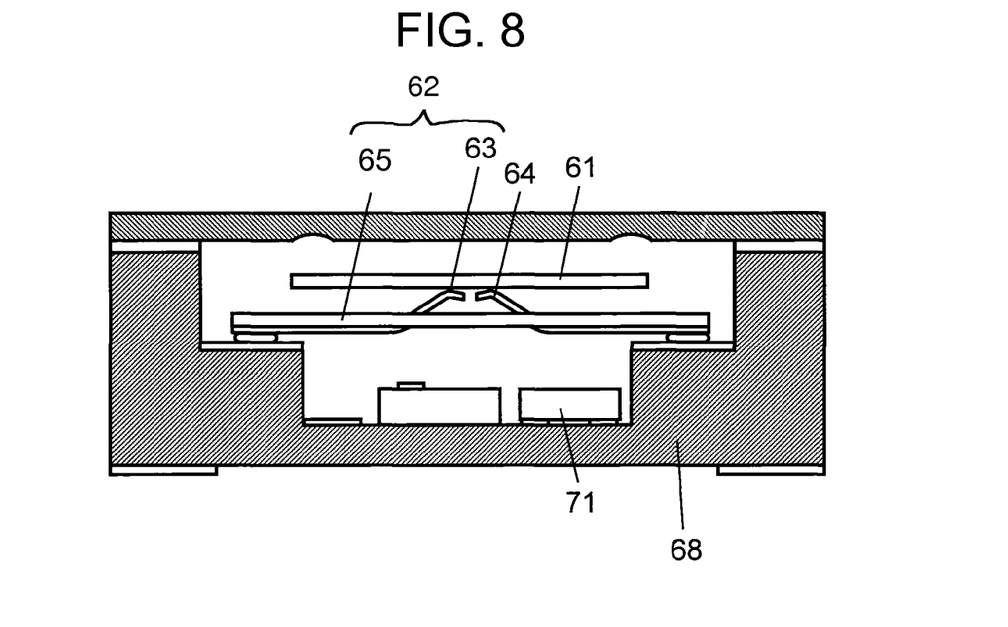
FIG. 8 shows an exploded perspective view of another angular velocity sensor in accordance with the second embodiment of the present invention.

FIG. 8 shows an exploded perspective view of another angular velocity sensor in accordance with the second embodiment of the present invention. Although FIG. 7 shows acceleration sensing section 66 placed on the underside of outer frame 66 of vibration isolator 62, FIG. 8 shows acceleration sensing section 71 placed on the inner bottom face of package 68. This structure also produces an advantage similar to what is discussed above.

INDUSTRIAL APPLICABILITY

The inertial sensor of the present invention reduces a surface mounting area of an angular velocity sensing element and an IC with disturbance vibrations suppressed, and yet, the inertial sensor allows reducing the number of electrode-pads working for inputting or outputting signals so that the sensor can be downsized. The inertial sensor thus can be used in a variety of electronic devices.

The invention claimed is:
1. A sensor comprising:
a sensing element wherein the sensing element has a first member having an electrode pad and a second member on the first member, and a side surface of the first member and a side surface of the second member lie in the same plane at a portion connecting the first member and the second member;
an IC on which the sensing element is mounted, comprising a first side, a second side, a third side, and a fourth side on a plane surface, the IC having pads at the first side of the IC and pads at the second side of the IC, the first side being opposite to the second side; and a package which houses the sensing element and the IC, the package having a first portion and a second portion positioned lower than the pads at the first side and the pads at the second side, wherein at least one of the pads at the first side is directly connected to the first portion via a first wire, at least one of the pads at the second side is directly connected to the second portion via a second wire, an area of the sensing element is smaller than an area of the IC in plan view, all of the pads at the first side are aligned straight on a first single imaginary straight line parallel to the first side, all of the pads at the second side are aligned straight on a second single imaginary straight line parallel to the second side, the IC has the third side perpendicular to the first side of the IC and the fourth side opposite to the third side, and no pads are at the third side and no pads are at the fourth side of the IC.

2. A sensor of claim 1, wherein
the sensing element is an angular velocity sensing element.
3. A sensor of claim 1, wherein
the IC is in contact with the sensing element.
4. A sensor of claim 1, wherein
the IC is mounted on a mounting base,
the mounting base has the first portion and the second portion.
5. A sensor of claim 1, wherein
the package has pads at the package positioned lower than the first portion and the second portion,
the first portion is electrically connected to one of the pads at the package, and
the second portion is electrically connected to one of the pads at the package.
6. A sensor comprising:
a sensing element wherein the sensing element has a first member having an electrode pad and a second member on the first member, and a side surface of the first member and a side surface of the second member lie in the same plane at a portion connecting the first member and the second member;
an IC on which the sensing element is mounted, comprising a first side, a second side, a third side, and a fourth side on a plane surface, the IC having pads aligned at the first side of the IC and pads aligned at the second side of the IC, the first side being opposite to the second side; and
a part positioned lower than the IC, the part having a first portion and a second portion,
wherein at least one of the pads at the first side is directly connected to the first portion via a first wire,
at least one of the pads at the second side is directly connected to the second portion via a second wire,
an area of the sensing element is smaller than an area of the IC in plan view,
all of the pads at the first side are aligned straight on a first single imaginary straight line parallel to the first side,
all of the pads at the second side are aligned straight on a second single imaginary straight line parallel to the second side,
the IC has the third side perpendicular to the first side of the IC and the fourth side opposite to the third side, and
no pads are presented in both of the third side and the fourth side of the IC.
7. A sensor of claim 6, wherein
the sensing element is an angular velocity sensing element.
8. A sensor of claim 6, wherein
the IC is in contact with the sensing element.
9. A sensor comprising:
a sensing element having a first pad at the sensing element wherein the sensing element has a first member having an electrode pad and a second member on the first member, and a side surface of the first member and a side surface of the second member lie in the same plane at a portion connecting the first member and the second member;
an IC comprising a first side, a second side, a third side, and a fourth side on a plane surface, the IC having pads aligned at the first side of the IC and pads aligned at the second side of the IC, the first side being opposite to the second side; and
a package having a pad at the package,
wherein the pad at the sensing element is electrically connected to at least one of the pads at the first side via a first wire,
at least one of the pads at the second side is electrically connected to the pad at the package via a second wire,
all of the pads at the first side are aligned straight on a first single imaginary straight line parallel to the first side,
all of the pads at the second side are aligned straight on a second single imaginary straight line parallel to the second side,
the IC has the third side perpendicular to the first side of the IC and the fourth side opposite to the third side, and
no pads are presented in both of the third side and the fourth side of the IC.
10. A sensor of claim 9, wherein
the pad at the sensing element is positioned higher than the pads at the first side and the pads at the second side, and
the pads at the first side and the pads at the second side are positioned higher than the pad at the package.
11. A sensor of claim 9, wherein
the sensing element is an angular velocity sensing element.
12. A sensor of claim 9, wherein
the sensing element is in contact with the IC.
13. A sensor of claim 9, wherein
wherein the pad at the sensing element is directly connected to at least one of the pads at the first side via the first wire.
14. A sensor comprising:
a sensing element having a pad at the sensing element wherein the sensing element has a first member having an electrode pad and a second member on the first member, and a side surface of the first member and a side surface of the second member lie in the same plane at a portion connecting the first member and the second member;
an IC comprising a first side, a second side, a third side, and a fourth side on a plane surface, the IC having pads aligned at the first side of the IC and pads aligned at the second side of the IC, the first side being opposite to the second side; and
a mounting base,
wherein the pad at the sensing element is directly connected to at least one of the pads at the first side via a first wire,
at least one of the pads at the second side is directly connected to the mounting base via a second wire,
all of the pads at the first side are aligned straight on a first single imaginary straight line parallel to the first side, all of the pads at the second side are aligned straight on a second single imaginary straight line parallel to the second side,
the IC has the third side perpendicular to the first side of the IC and the fourth side opposite to the third side, and
no pads are presented in both of the third side and the fourth side of the IC.

15. A sensor of claim 14, wherein
the IC is mounted on the mounting base,
the pad at the sensing element is positioned higher than the pads at the first side and the pads at the second side, and
the pads at the first side and the pads at the second side are positioned higher than a portion of the mounting base which the second wire is connected to.

16. A sensor of claim 14, wherein
the sensing element is an angular velocity sensing element.

17. A sensor of claim 1, wherein
an area of an upper surface of the first member is larger than an area of an upper surface of the second member in plan view.

18. A sensor of claim 1, wherein
the first portion is positioned at the third side.

19. A sensor of claim 18, wherein
the second portion is positioned at the fourth side.

20. A sensor of claim 1, wherein
all portions of the first portion are lower than the pads at the first side and the pads at the second side, and
all portions of the second portion are lower than the pads at the first side and the pads at the second side.

21. A sensor of claim 20, wherein
the first portion is positioned at the third side.

22. A sensor of claim 6, wherein
the second portion is positioned at the fourth side.

23. A sensor of claim 6, wherein
all portions of the first portion are lower than the pads at the first side and the pads at the second side, and
all portions of the second portion are lower than the pads at the first side and the pads at the second side.

24. A sensor of claim 9, wherein
all portions of the pad at the package are lower than the pads at the first side and the pads at the second side.

25. A sensor of claim 24, wherein
the pad at the package is positioned at the third side.

26. A sensor of claim 14, wherein
all portions of the mounting base to which the second wire is connected are lower than the pads at the first side and the pads at the second side.

* * * * *